(12) United States Patent
Kato (10) Patent No.: US 11,417,521 B2
(45) Date of Patent: Aug. 16, 2022

(54) FILM FORMING METHOD AND FILM FORMING APPARATUS

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/150,177

(22) Filed: Jan. 15, 2021

(65) Prior Publication Data

US 2021/0249264 A1   Aug. 12, 2021

(30) Foreign Application Priority Data

Feb. 6, 2020 (JP) .............................. JP2020-019159

(51) Int. Cl.
| | |
|---|---|
| *H01L 21/02* | (2006.01) |
| *C23C 16/455* | (2006.01) |
| *H01L 21/311* | (2006.01) |
| *C23C 16/32* | (2006.01) |

(52) U.S. Cl.
CPC ...... *H01L 21/02529* (2013.01); *C23C 16/325* (2013.01); *C23C 16/45529* (2013.01); *H01L 21/0262* (2013.01); *H01L 21/02488* (2013.01); *H01L 21/02645* (2013.01); *H01L 21/31116* (2013.01)

(58) Field of Classification Search
None
See application file for complete search history.

(56) References Cited

U.S. PATENT DOCUMENTS

2021/0249264 A1* 8/2021 Kato ................. H01L 21/02529

FOREIGN PATENT DOCUMENTS

JP        2014-082419        5/2014

* cited by examiner

*Primary Examiner* — Jack S Chen
(74) *Attorney, Agent, or Firm* — IPUSA, PLLC (57) ABSTRACT

A film forming method forms a silicon film on a substrate placed on a turntable which rotates and passes through first and second process regions that are mutually separated along a circumferential direction inside a vacuum chamber that is settable to a first temperature at which Si—H bond dissociation can occur. A film forming process includes forming a molecular layer of $SiH_3$ on the substrate, by supplying a $Si_2H_6$ gas that is set to a second temperature higher than the first temperature during a time period in which the substrate passes through the first process region, and forming a molecular layer of $SiCl_3$ on the substrate having the molecular layer of $SiH_3$ formed thereon while causing the Si—H bond dissociation in the molecular layer of $SiH_3$, by supplying a gas including silicon and chlorine during a time period in which the substrate passes through the second process region.

11 Claims, 9 Drawing Sheets

FILM FORMING METHOD AND FILM FORMING APPARATUS

CROSS-REFERENCE TO RELATED APPLICATIONS

This application is based upon and claims priority to Japanese Patent Application No. 2020-019159, filed on Feb. 6, 2020, the entire contents of which are incorporated herein by reference.

BACKGROUND

1. Field of the Invention

The present disclosure relates to film forming methods and film forming apparatuses. The film forming method may also be referred to as a film deposition method, and the film forming apparatus may also be referred to as a film deposition apparatus.

2. Description of the Related Art

A known technique for forming a silicon film on a substrate inside an approximately cylindrical vacuum chamber, such as that described in Japanese Laid-Open Patent Publication No. 2014-82419, for example, repeats the steps of forming a molecular layer of $SiH_3$ on a surface of the substrate, and causing Si—H bond dissociation in the molecular layer of $SiH_3$, so that only a silicon atomic layer remains on the surface.

SUMMARY

According to one aspect of the embodiments, a film forming method for forming a silicon film on a substrate placed on a turntable which rotates and passes through a first process region and a second process region that are mutually separated along a circumferential direction of the turntable inside a vacuum chamber that is settable to a first temperature at which Si—H bond dissociation can occur, includes a film forming process that includes forming a molecular layer of $SiH_3$ on a surface of the substrate, by supplying a $Si_2H_6$ gas that is set to a second temperature higher than the first temperature during a time period in which the substrate passes through the first process region; and forming a molecular layer of $SiCl_3$ on the surface of the substrate having the molecular layer of $SiH_3$ formed thereon while causing the Si—H bond dissociation in the molecular layer of $SiH_3$, by supplying a gas including silicon and chlorine during a time period in which the substrate passes through the second process region.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

A description will hereinafter be given of non-limiting embodiments of the present disclosure, with reference to the accompanying drawings. In all of the accompanying drawings, the same or corresponding parts or components will be designated by the same or corresponding reference numerals, and a repeated description of the same or corresponding parts or components will be omitted.

The present disclosure, according to one aspect of the embodiments, provides a technique for forming a silicon film having an excellent film quality, with a high productivity.

[Film Forming Apparatus]

Figure 1:
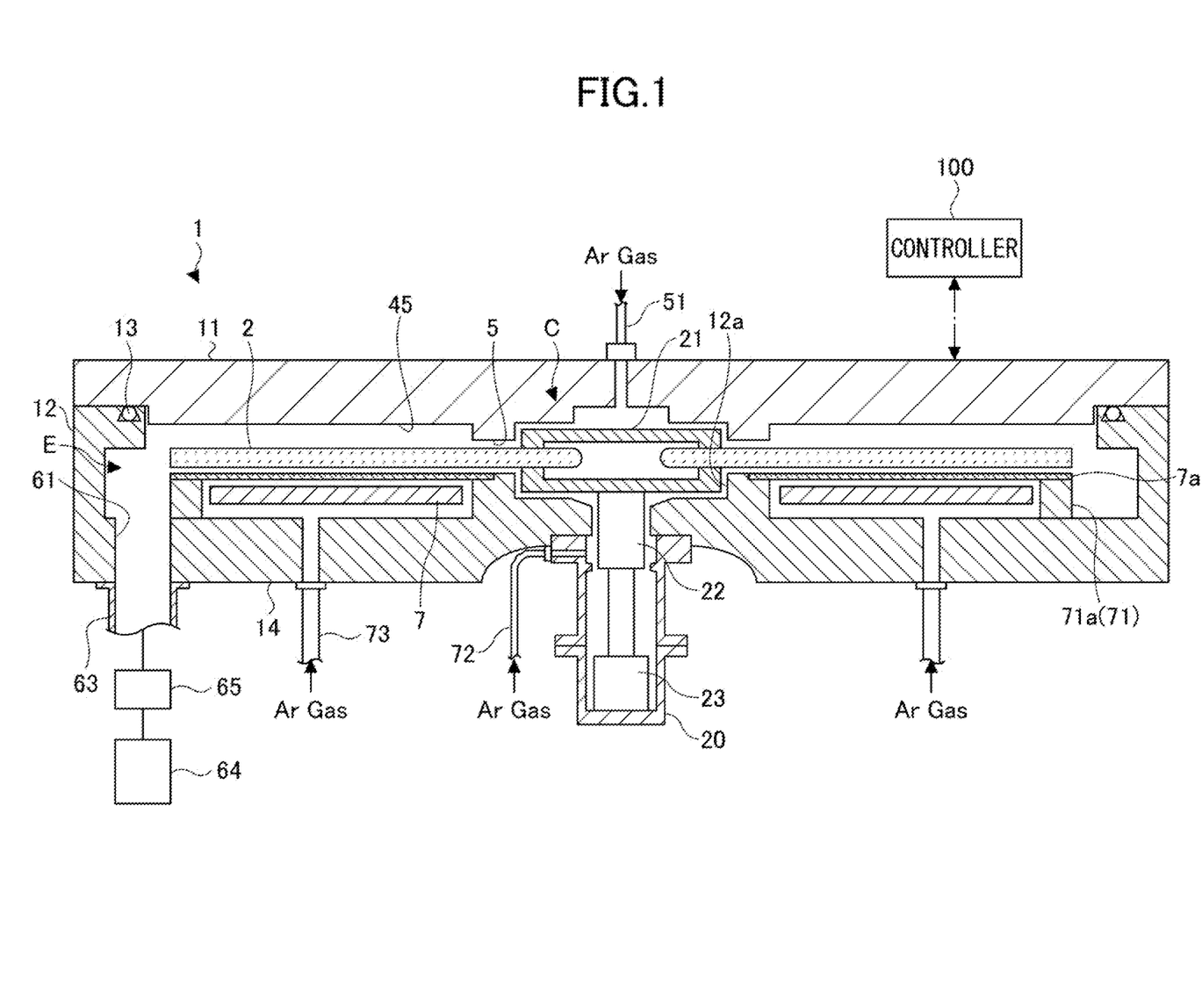
FIG. 1 is a cross sectional view illustrating an example of a film forming apparatus according to one embodiment.
Figure 2:
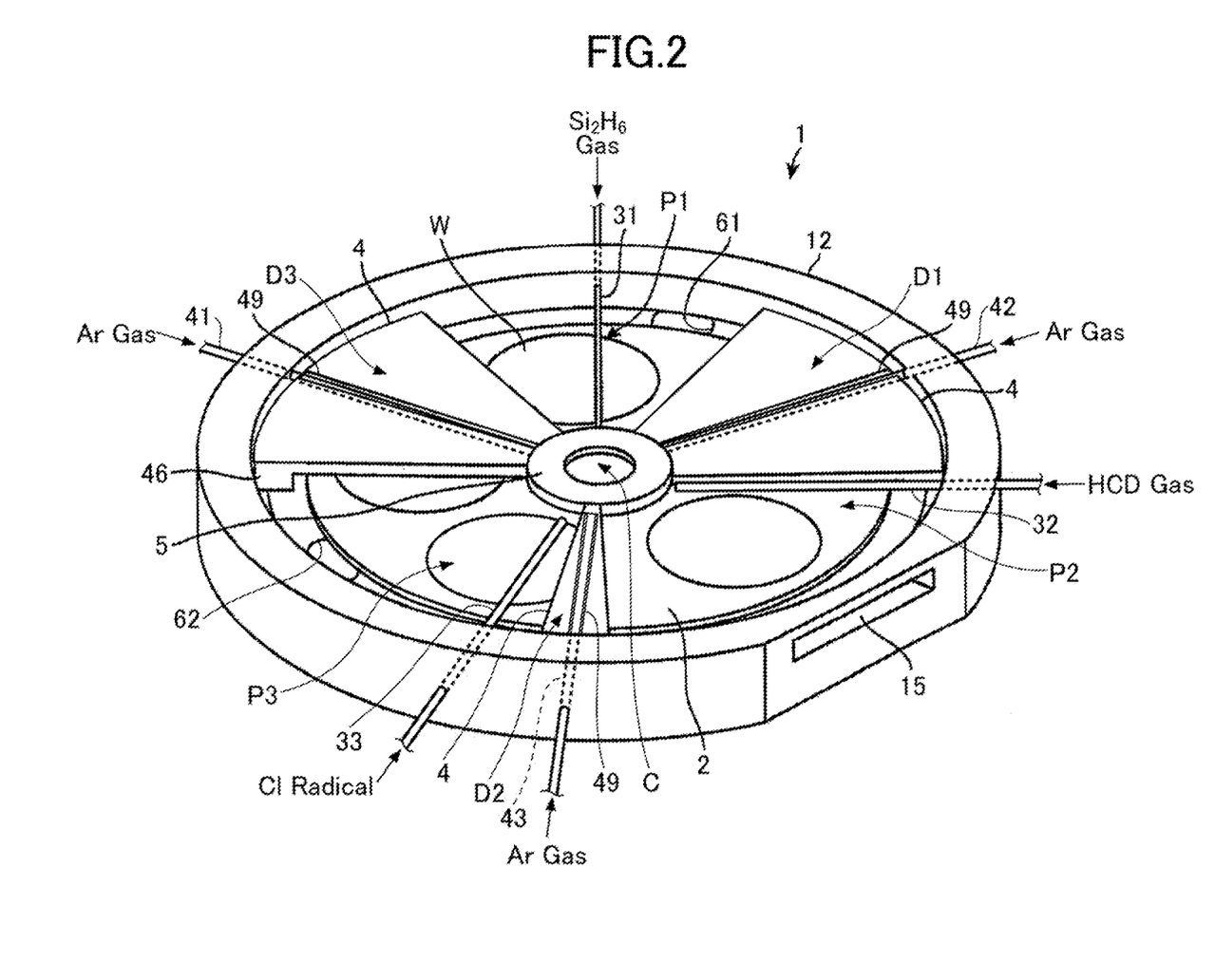
FIG. 2 is a perspective view illustrating an example of an internal configuration of the film forming apparatus of FIG. 1.
Figure 3:
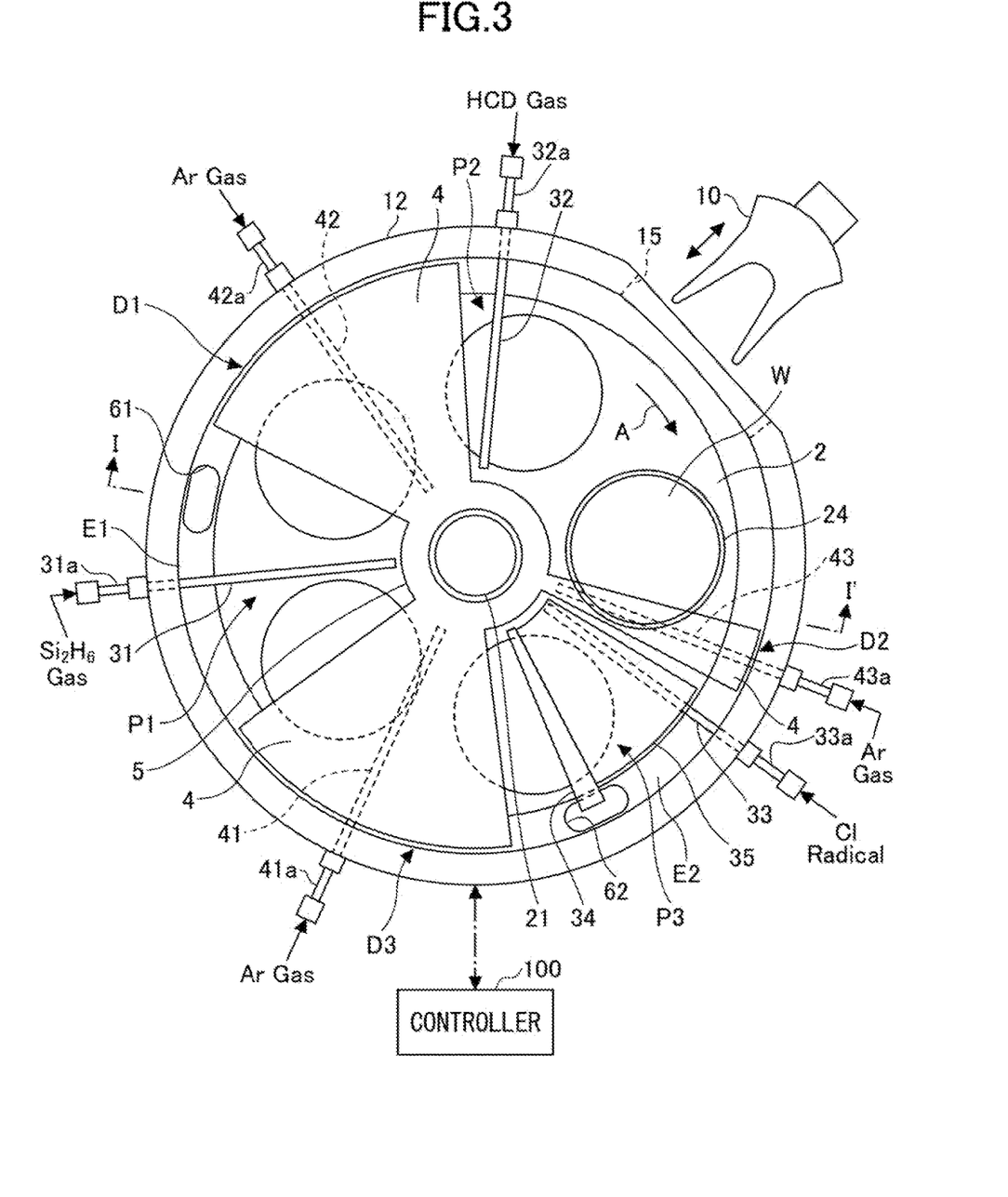
FIG. 3 is a top view illustrating the example of the internal configuration of the film forming apparatus of FIG. 1.

FIG. 1 is a cross sectional view illustrating an example of a film forming apparatus according to one embodiment. FIG. 2 is a perspective view illustrating an example of an internal configuration of the film forming apparatus according to one embodiment. FIG. 3 is a top view illustrating the example of the internal configuration of the film forming apparatus according to one embodiment.

As illustrated in FIG. 1 through FIG. 3, the film forming apparatus includes a flat vacuum chamber 1 having an approximately circular planar shape, and a turntable 2, disposed inside the vacuum chamber 1, and having a center of rotation at a center of the vacuum chamber 1. As illustrated in FIG. 1, the vacuum chamber 1 includes a chamber body 12 having a cylindrical shape with a bottom, and a top plate 11 which is detachably disposed on an upper surface of the chamber body 12 in an airtight manner via a sealing member 13, such as an O-ring.

In addition, as illustrated in FIG. 1, the turntable 2 is fixed to a cylindrical core part 21 at a center part thereof, and the core part 21 is fixed to an upper end of a rotating shaft 22 which extends in a vertical direction. The rotating shaft 22 penetrates a bottom part 14 of the vacuum chamber 1, and a lower end of the rotating shaft 22 is attached to a driving section 23 which rotates the rotating shaft 22 around a vertical axis. The rotating shaft 22 and the driving section 23 are accommodated inside a cylindrical casing body 20 having an open upper surface. A flange portion provided on the upper surface of the casing body 20 is mounted on a lower surface of the bottom part 14 of the vacuum chamber 1 in an airtight manner, so that an airtight state is maintained between the atmosphere inside the casing body 20 and the atmosphere outside the casing body 20.

A heater unit 7 is provided in a space between the turntable 2 and the bottom part 14 of the vacuum chamber 1. The heater unit 7 has an annular shape, and maintains the inside of the vacuum chamber 1 at a constant temperature from underneath the turntable 2. In this embodiment, the inside of the vacuum chamber 1 is maintained at a predetermined temperature at which Si—H bond dissociation can occur. More particularly, because the Si—H bond dissociation occurs at approximately 550° C., the heater unit 7 heats the inside of the vacuum chamber 1 so that the temperature inside the vacuum chamber 1 is approximately 550° C., such as a temperature in a range of 540° C. to 580° C., and more preferably in a range of 550° C. to 570° C., for example.

As illustrated in FIG. 2 and FIG. 3, circular recesses 24 in which a plurality of substrates (five substrates in the example illustrated) are placed, are provided on a surface of the turntable 2 along a rotating direction (or circumferential direction) of the turntable 2. In this embodiment, an example in which a semiconductor wafer (hereinafter simply referred to as a "wafer W") is used as the substrate will be described. For the sake of convenience, FIG. 3 illustrates the wafer W placed in only one recess 24. The recess 24 has an inner diameter slightly greater, for example, 2 mm greater than a diameter of the wafer W, and a depth approximately the same as a thickness of the wafer W. Accordingly, when the wafer W is placed and accommodated in the recess 24, a top surface of the wafer W and the surface of the turntable 2 (that is, an area of the turntable 2 where the wafer W is not placed) become the same height. Through holes (not illustrated) are formed in a bottom surface of the recess 24, and for example, three raising and lowering pins penetrate the through holes and support a back surface of the wafer W, to raise and lower the wafer W. Stages on which the plurality of wafers W are placed, may be provided on the surface of the turntable 2 along the circumferential direction of the turntable 2, in place of the recesses 24 in which the wafers W are placed. Each stage may be configured to be rotatable with respect to the turntable 2.

FIG. 2 and FIG. 3 illustrate the configuration inside the vacuum chamber 1, and for the sake of convenience, the illustration of the top plate 11 is omitted. As illustrated in FIG. 2 and FIG. 3, reaction gas nozzles 31, 32, and 33, and separation gas nozzles 41, 42, and 43, which are respectively made of quartz, for example, are disposed above the turntable 2 and spaced apart from each other in the circumferential direction of the vacuum chamber 1. In the illustrated example, the separation gas nozzle 43, the reaction gas nozzle 33, the separation gas nozzle 41, the reaction gas nozzle 31, the separation gas nozzle 42, and the reaction gas nozzle 32 are disposed clockwise in this order from a transport opening 15 which will be described later. Inlet ports 31a, 32a, and 33a at base end portions of the reaction gas nozzles 31, 32, and 33 illustrated in FIG. 3 are fixed to an outer peripheral wall of the chamber body 12, to introduce the reaction gas nozzles 31, 32, and 33 from the outer peripheral wall of the vacuum chamber 1 into the inside of the vacuum chamber 1. In addition, the reaction gas nozzles 31, 32, and 33 are mounted to extend horizontally with respect to the turntable 2 in a radial direction of the chamber body 12. Inlet ports 41a, 42a, and 43a at base end portions of the separation gas nozzles 41, 42, and 43 illustrated in FIG. 3 are fixed to the outer peripheral wall of the chamber body 12, to introduce the separation gas nozzles 41, 42, and 43 from the outer peripheral wall of the vacuum chamber 1 into the inside of the vacuum chamber 1. Further, the separation gas nozzles 41, 42, and 43 are mounted to extend horizontally with respect to the turntable 2 in the radial direction of the chamber body 12.

In this embodiment, the reaction gas nozzle 31 is connected to a source (not illustrated) of disilane ($Si_2H_6$) gas as the reaction gas, via a pipe, a flow controller (or flow control valve), or the like which are not illustrated. In addition, the reaction gas nozzle 31 is connected to a source (not illustrated) of diisopropylaminosilane (DIPAS) gas as an aminosilane-based gas, via a pipe, a flow controller (or flow control valve), or the like which are not illustrated. The reaction gas nozzle 32 is connected to a source (not illustrated) of a hexachlorodisilane (HCDS: $Si_2Cl_6$) gas as the reaction gas, via a pipe, a flow controller (or flow control valve), or the like, which are not illustrated. Moreover, the reaction gas nozzle 33 is connected to a source (not illustrated) of a chlorine ($Cl_2$) gas as an etching gas, via a pipe, a flow controller (or flow control valve), or the like which are not illustrated. The source of chlorine gas produces an active species of chlorine gas (hereinafter referred to as "chlorine (Cl) radical") by plasma, for example, and supplies the resulting chlorine radical to the reaction gas nozzle 33. The separation gas nozzles 41, 42, and 43 are all connected to a source (not illustrated) of an argon (Ar) gas as the separation gas, via a pipe, a flow controller (or flow control valve), or the like which are not illustrated.

Figure 4:
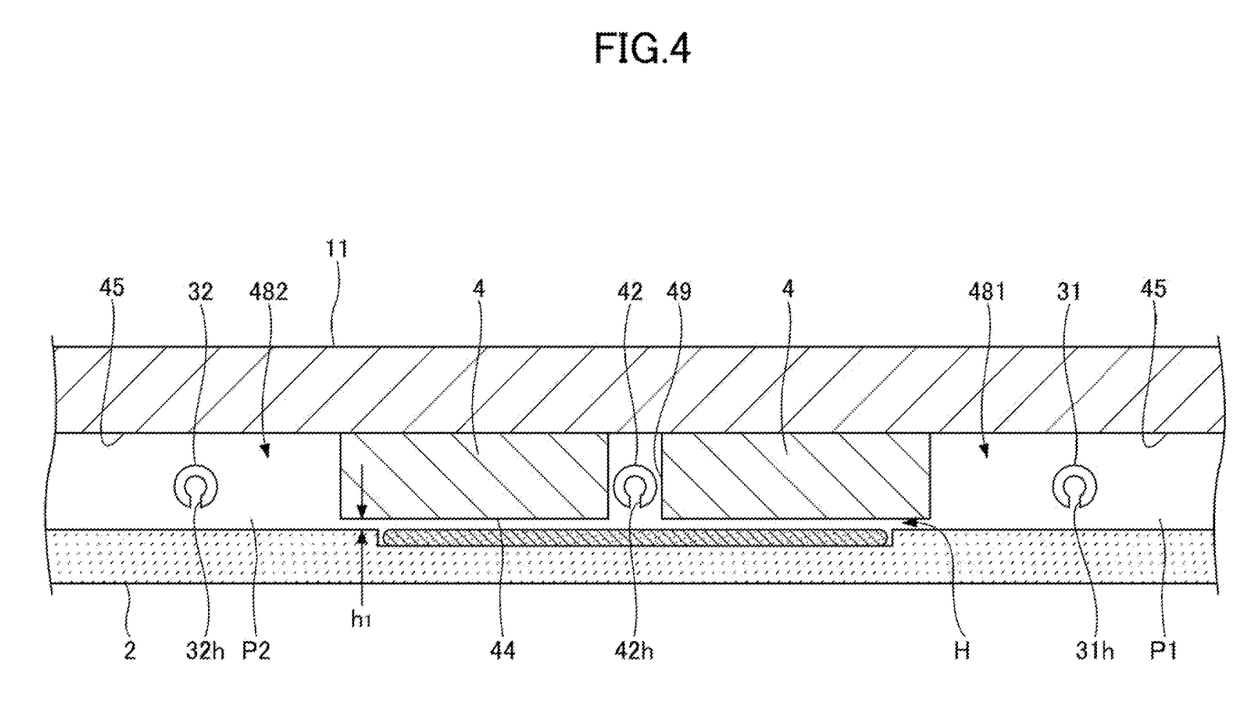
FIG. 4 is a cross sectional view illustrating a vacuum chamber along a circumferential direction of a turntable.

In the reaction gas nozzles 31 and 32, a plurality of gas discharge holes 31h and 32h illustrated in FIG. 4, opening toward the turntable 2, are respectively disposed along a length direction of the reaction gas nozzles 31 and 32 at 10 mm intervals, for example. A lower region of the reaction gas nozzle 31 forms a first process region P1 for adsorbing $SiH_3$ decomposed by the $Si_2H$ (gas on the wafer W. A lower region of the reaction gas nozzle 32 forms a second process region P2 for desorbing H from the $SiH_3$ adsorbed on the wafer W in the first process region P1, and for adsorbing $SiCl_3$ decomposed by the HCDS gas on the wafer W. Further, a region separated from the second process region P2 along the circumferential direction of the turntable 2, and provided with the reaction gas nozzle 33, forms a third process region P3 where an anisotropic etching is performed.

A regulator plate 35 having a fan-shape is provided above the reaction gas nozzle 33, to cover the reaction gas nozzle 33 from above the reaction gas nozzle 33. The fan-shape of the regulator plate 35 spreads toward an upstream side and a downstream side along the rotating direction of the turntable 2 indicated by an arrow A in FIG. 3. Details of the third process region P3 will be described later.

A first separation region D1 is provided between the first process region P1 and the second process region P2. A second separation region D2 is provided between the second process region P2 and the third process region P3. A third separation region D3 is provided between the third process region P3 and the first process region P1.

When the turntable 2 rotates clockwise, the wafer W placed in the recess 24 continuously and sequentially passes through the first process region P1, the first separation region D1, the second process region P2, the second separation region D2, the third process region P3, and the third separation region D3. In this case, when the wafer W passes through the first process region P1 in a state where the inside of the vacuum chamber 1 is maintained to the temperature (approximately 550° C.) at which the Si—H bond dissociation can occur, the $Si_2H_6$ gas is supplied from the reaction gas nozzle 31, and pyrolyzed $SiH_3$ is adsorbed as a molecular layer on the surface of the wafer W. Because the disilane gas decomposes to $SiH_3$ at approximately 450° C., the disilane gas can easily decompose at a temperature setting of this embodiment, namely, approximately 550° C. The surface of the wafer W is formed of silicon (Si), and the Si on the wafer surface and the Si of $SiH_3$ decomposed from the disilane gas adsorb to each other. Thereafter, as the turntable 2 rotates, the wafer W enters the first separation region D1, and the wafer surface is purged with the Ar gas. As a result, no excess molecules adhere to the molecular layer of $SiH_3$, thereby maintaining the state of the molecular layer. In other words, no excess Chemical Vapor Deposition (CVD) reaction occurs. Next, as the turntable 2 rotates further, the wafer W enters the second process region P2. As the wafer W passes through the second process region P2, the HCDS gas is supplied from the reaction gas nozzle 32, Si—H bond dissociation occurs, and the pyrolyzed $SiCl_3$ is adsorbed as a molecular layer on the surface of the wafer W. In addition, as the turntable 2 rotates further, the wafer W enters the second separation region D2, and the purge gas is supplied to remove dust or the like from the wafer surface. As the turntable 2 rotates further, the wafer W enters the first process region P1 in a state where the molecular layer of $SiCl_3$ is formed on the wafer surface and dust or the like is removed from the wafer surface. Accordingly, a silicon film can be formed on the surface of the wafer W by repeating processes similar to the processes described above.

By continuously performing such a series of processes as the turntable 2 rotates, it is possible to form a silicon film having a desired thickness on the surface of the wafer W. The film forming apparatus according to this embodiment is configured to perform such a film forming process, and individual constituent elements thereof will be described in more detail below.

FIG. 4 illustrates a cross section of the vacuum chamber 1 along a concentric circle of the turntable 2, from the first process region P1 to the second process region P2. As illustrated in FIG. 4, a convex part 4 is mounted on a back surface of the top plate 11. For this reason, a lower surface of the convex part 4, forming a flat low ceiling surface (hereinafter referred to as a "first ceiling surface 44"), and a ceiling surface (hereinafter referred to as a "second ceiling surface 45") higher than the first ceiling surface 44, located on both sides of the first ceiling surface 44 along the circumferential direction, are provided inside the vacuum chamber 1. The first ceiling surface 44 has a top portion cut into an arcuate shape, and has a planar shape which is a fan-shape. As illustrated in FIG. 2 and FIG. 4, a groove 49, which extends in the radial direction, is formed at a center of the convex part 4 along the circumferential direction, and the separation gas nozzle 42 is accommodated within the groove 49. Two other convex parts 4 are similarly formed with grooves 49, respectively, and the separation gas nozzles 41 and 43 are accommodated within the respective grooves 49. In addition, the reaction gas nozzles 31 and 32 are provided in respective spaces under the second ceiling surface 45. These reaction gas nozzles 31 and 32 are provided near the wafer W, and are separated from the second ceiling surface 45. As illustrated in FIG. 4, the reaction gas nozzle 31 is provided in a space 481 under the second ceiling surface 45 on the right side of the convex part 4, and the reaction gas nozzle 32 is provided in a space 482 under the second ceiling surface 45 on the left side of the convex part 4.

A plurality of gas discharge holes 42h, opening toward the turntable 2, are disposed in the separation gas nozzle 42 that is accommodated within the groove 49 of the convex part 4 along the length direction of the separation gas nozzle 42, at 2 mm intervals, for example. Further, although the illustration thereof will be omitted, a plurality of gas discharge holes, opening toward the turntable 2, are disposed in the separation gas nozzles 41 and 43 along the length direction of the separation gas nozzles 41 and 43, respectively, at 2 mm intervals, for example, similar to the separation gas nozzle 42.

The first ceiling surface 44 forms a separation space H, which is a narrow space, with respect to the turntable 2. When the Ar gas is supplied from the gas discharge holes 42h of the separation gas nozzle 42, the Ar gas flows through the separation space H toward the spaces 481 and 482. Because a volume of the separation space H is smaller than volumes of the spaces 481 and 482, the Ar gas can make the pressure at the separation space H high compared to the pressures at the spaces 481 and 482. In other words, the separation space H having the high pressure can be formed between the space 481 and the space 482. In addition, the Ar gas flowing from the separation space H into the spaces 481 and 482 acts as a counter-flow with respect to the $Si_2H_6$ gas from the first process region P1 and the HCDS gas from the second process region P2. Accordingly, the $Si_2H_6$ gas from the first process region P1 and the HCDS gas from the second process region P2 are separated by the separation space H. For this reason, mixing of the $Si_2H_6$ gas and the HCDS gas in the vacuum chamber 1 can be reduced.

A height h1 of the first ceiling surface 44 relative to the upper surface of the turntable 2 is set to a height suitable for making the pressure of the separation space H higher than the pressures of the spaces 481 and 482, by taking into consideration the pressure inside the vacuum chamber 1, the rotational speed of the turntable 2, the flow rate of the supplied separation gas, or the like during the forming of the film.

On the other hand, as illustrated in FIG. 2 and FIG. 3, a protrusion 5, surrounding an outer circumference of the core part 21 which fixes the turntable 2, is provided on the lower surface of the top plate 11. In this embodiment, the protrusion 5 is continuous with a portion of the convex part 4 on the side of the center of rotation, and a lower surface of the protrusion 5 is formed at the same height as the first ceiling surface 44.

FIG. 1 referred above is a cross sectional view along a line I-I' in FIG. 3, and illustrates a region where the second ceiling surface 45 is provided.

Figure 5:
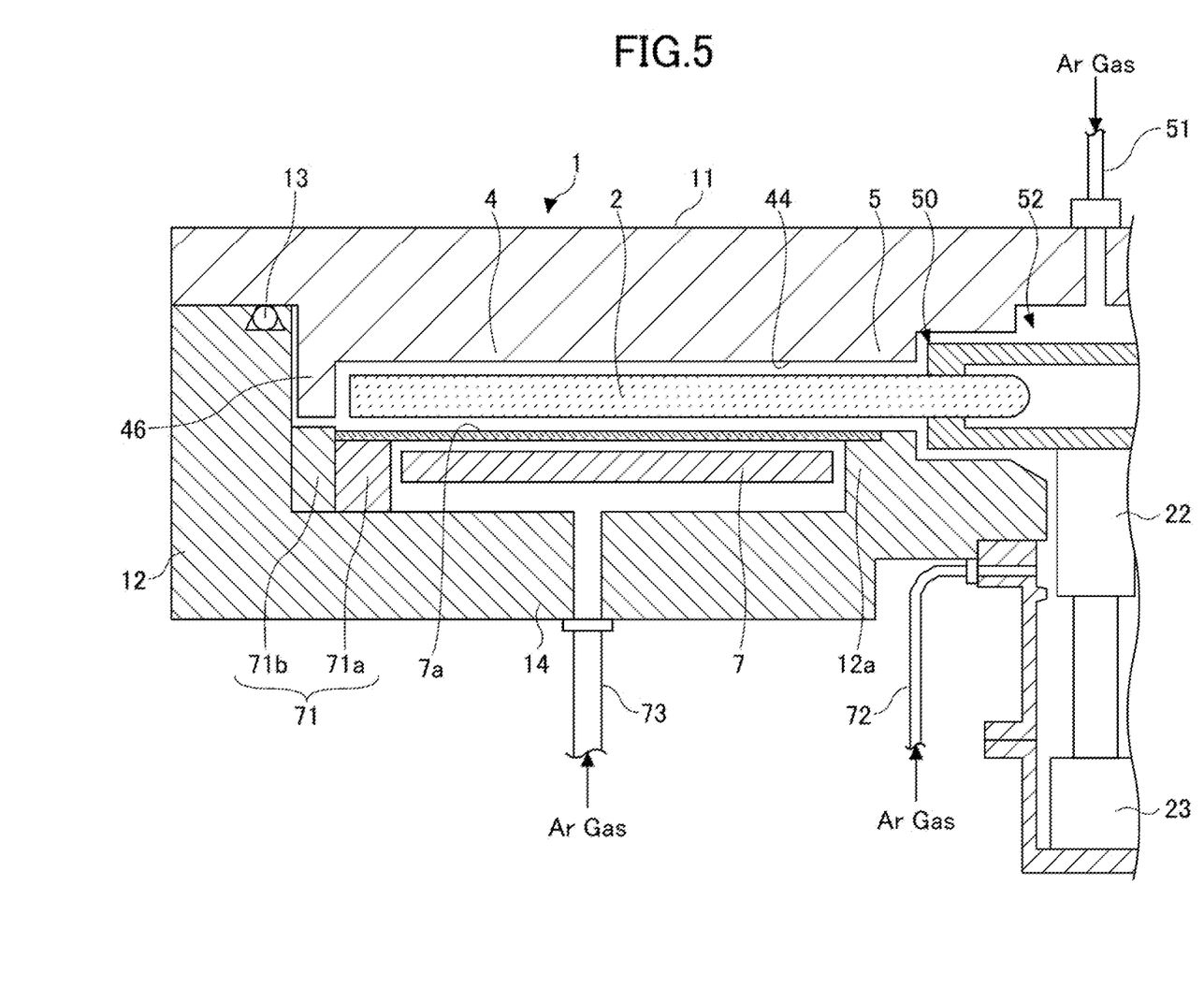
FIG. 5 is a cross sectional view of a vacuum chamber along a radial direction of a turntable.

FIG. 5 is a cross sectional view illustrating a region where the first ceiling surface 44 is provided. As illustrated in FIG. 5, a bent portion 46, bent in an L-shape to oppose an outer end surface of the turntable 2, is formed on an outer edge portion of the fan-shaped convex cart 4. Similar to the convex part 4, the bent portion 46 reduces the reaction gas from the first process region P1 entering the first separation region D1, thereby reducing generation of the CVD reaction. Because the fan-shaped convex part 4 is provided on the top plate 11, and the top plate 11 detachable from the chamber body 12, there is a slight gap between the outer peripheral wall of the bent portion 46 and the chamber body 12. A gap between an inner peripheral wall of the bent portion 46 and the outer end surface of the turntable 2, and a gap between an outer peripheral wall of the bent portion 46 and the chamber body 12, are set to a dimension similar to the height of the first ceiling surface 44 with respect to the upper surface of the turntable 2, for example.

In the first separation region D1, the second separation region D2, and the third separation region D3, the inner peripheral wall of the chamber body 12 is formed on a vertical plane (that is, formed as a vertical surface) in a proximity to the outer peripheral wall of the bent portion 46, as illustrated in FIG. 5. On the other hand, in portions other than the first separation region D1, the second separation region D2, and the third separation region D3, the inner peripheral wall is depressed outwardly from a portion facing the outer end surface of the turntable 2 toward the bottom part 14, for example, as illustrated in FIG. 1. For the sake of convenience, the depressed portion having an approximately rectangular cross sectional shape will be referred to as an exhaust region E in the following description. More particularly, as illustrated in FIG. 3, an exhaust region communicating to the first process region P1 will be referred to as a first exhaust region E1, and an exhaust region communicating to the second and third process regions P2 and P3, will be referred to as a second exhaust region E2. As illustrated in FIG. 1 through FIG. 3, a first exhaust port 61 and a second exhaust port 62 are formed in bottom portions of the first exhaust region E1 and the second exhaust region E2, respectively. The first exhaust port 61 and the second exhaust port 62 are respectively connected to an exhaust device, such as a vacuum pump 64 or the like, via an exhaust pipe 63, as illustrated in FIG. 1. A pressure controller 65 is inserted with respect to the exhaust pipe 63.

Figure 6:
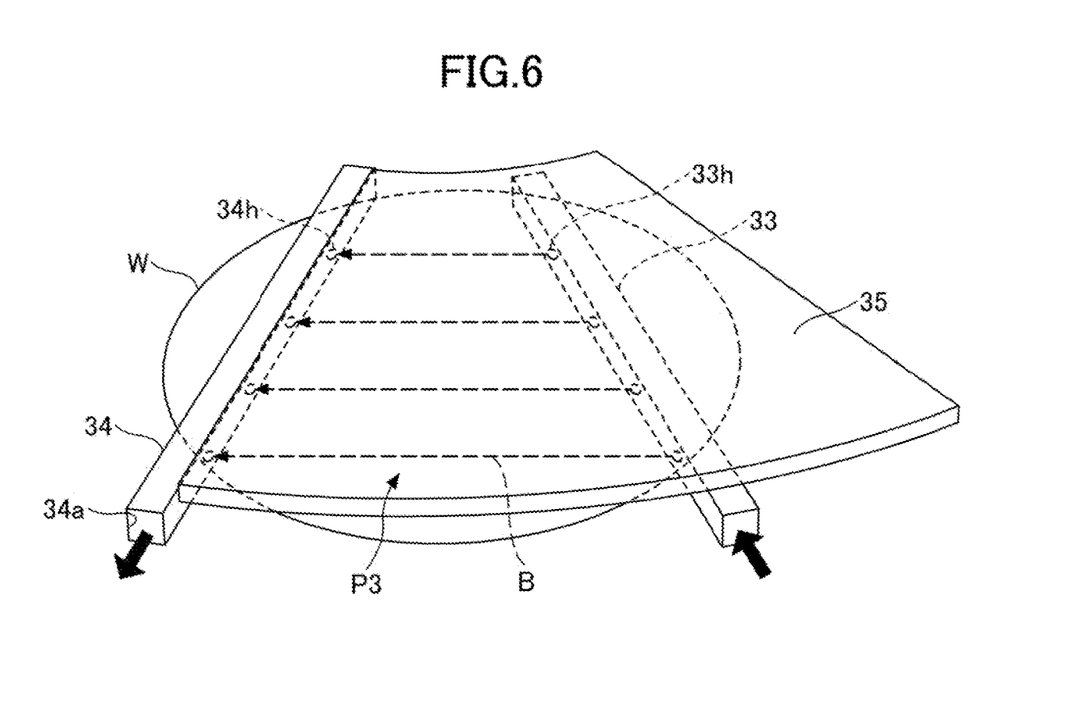
FIG. 6 is a diagram for explaining a third process region of the film forming apparatus illustrated in FIG. 1.

FIG. 6 is a diagram for explaining the third process region P3 of the film forming apparatus illustrated in FIG. 1. As illustrated in FIG. 6, a plurality of gas discharge holes 33h, opening toward the downstream side of the reaction gas nozzle 33, are disposed along the length direction of the reaction gas nozzle 33 at 10 mm intervals, for example. Accordingly, the chlorine radical, discharged from the gas discharge holes 33h of the reaction gas nozzle 33, flows along the rotating direction of the turntable 2, as indicated by an arrow B in FIG. 6.

An exhaust duct 34 is provided on the downstream side of the reaction gas nozzle 33, more particularly, on the downstream side of the regulator plate 35. The exhaust duct 34 is provided to extend along the radial direction from a position on an outer side of the turntable 2 toward the center of the turntable 2. A plurality of exhaust holes 34h, opening toward the upstream s-de of the exhaust duct 34, that is, toward the side provided with the reaction gas nozzle 33, are disposed along the length direction of the exhaust duct 34 at 10 mm intervals, for example. In addition, an opening 34a is formed on the outer side of the exhaust duct 34 in the radial direction. Hence, it is possible to directly exhaust the chlorine radical which is supplied from the reaction gas nozzle 33 and flows along the rotating direction of the turntable 2, and maintain the parallel flow in the horizontal direction. In other words, the chlorine radical flows approximately parallel to the surface of the wafer W. For this reason, in the case of the wafer W having the surface including a concave part, etching by the chlorine radical may easily occur because the chlorine radical easily reaches an upper inner wall portion of the concave part. On the other hand, virtually no chlorine radical reaches a lower inner wall portion and a bottom surface of the concave part, and thus, virtually no etching by chlorine radical occurs. As a result, it is possible to selectively remove the molecular layer of $SiCl_3$ on the upper inner wall portion of the concave part of the wafer W.

Referring again to FIG. 5, and as also described with reference to FIG. 1, the heater unit 7 is provided in the space between the turntable 2 and the bottom part 14 of the vacuum chamber 1. In the film forming apparatus according to this embodiment, the wafer W on the turntable 2 is heated to the temperature (for example, 550° C.) at which the Si—H bond dissociation can occur in the molecular layer of $SiH_3$ formed on the surface of the wafer W, via the turntable 2. A cover member 71 is provided under the turntable 2, in a proximity to a circumferential edge of the turntable 2. The cover member 71 has a ring shape, and partitions the atmosphere from the space above the turntable 2 to the first exhaust region E1 and the second exhaust region E2, and the atmosphere in which the heater unit 7 is disposed, to reduce the gas entering the region under the turntable 2. The cover member 71 includes an inner member 71a, and an outer member 71b. The inner member 71a is disposed under the turntable 2, to oppose an outer edge portion of the turntable 2, and a portion on an outer peripheral side than the outer edge portion of the turntable 2. The outer member 71b is disposed between the inner member 71a and the inner peripheral wall of the vacuum chamber 1. The outer member 71b is provided in the proximity to the bent portion 46, under the bent portion 46 formed on the outer edge portion of the convex part 4 in the first separation region D1 and the second separation region D2. The inner member 71a surrounds the entire periphery of the heater unit 7, under the outer edge portion of the turntable 2 (and under a portion slightly on the outer side than the outer edge portion of the turntable 2).

The bottom part 14 at a portion closer to the center of rotation of the turntable 2 than the space in which the heater unit 7 is disposed, protrudes upward to a proximity of the core part 21 near a center portion of a lower surface of the turntable 2, to form a protrusion 12a. A space between the protrusion 12a and the core part 21 is narrow. In addition, the rotating shaft 22 penetrates a through hole formed in the bottom part 14 of the vacuum chamber 1, and a space between the rotating shaft 22 and an inner peripheral wall of the bottom part 14 defining the through hole is narrow. These narrow spaces communicate with the casing body 20. The casing body 20 is provided with a purge gas supply pipe 72 for supplying and the Ar gas, which is a purge gas, into these narrow spaces to purge these narrow spaces. Further, a plurality of purge gas supply pipes 73 for purging the space in which the heater unit 7 is disposed, are provided at the bottom part 14 of the vacuum chamber 1, at predetermined angular intervals along the circumferential direction under the heater unit 7. Only one purge gas supply pipe 73 is visible in FIG. 5. A lid member 7a is provided between the heater unit 7 and the turntable 2, and provides coverage from the inner peripheral wall of the outer member 71b (the upper surface of the inner member 71a) to an upper end of the protrusion 12a along the circumferential direction, in order to reduce the gas entering the region where the heater unit 7 is provided. The lid member 7a may be made of quartz, for example.

A separation gas supply pipe 51 is connected to a center portion of the top plate 11 of the vacuum chamber 1, and is configured to supply the Ar gas, which is the separation gas, to a space 52 between the top plate 11 and the core part 21. The separation gas supplied to the space 52 is discharged toward the peripheral edge of the turntable 2 along the upper surface of the turntable 2 in a wafer mounting area of the turntable 2, via a narrow space 50 between the protrusion 5 and the turntable 2. The space 50 may be maintained at a pressure higher than the pressures at the space 481 and the space 482, by the separation gas. Accordingly, the space 50 reduces mixing of the $Si_2H_6$, gas supplied to the first process region P1 and the HCDS gas supplied to the second process region P2, via a center region C. In other words, the space 50 (or the center region C) functions similarly to the separation space H (or the first separation region D1, the second separation region D2, and the third separation region D3).

Further, as illustrated in FIG. 2 and FIG. 3, the transport opening 15, through which the wafer W is exchanged between an external transport arm 10 and the turntable 2, is provided in a sidewall of the vacuum chamber 1. The transport opening 15 is opened and closed by a gate valve (not illustrated). In addition, the wafer W is exchanged between the transport arm 10, and the recess 24 which is the wafer mounting area of the turntable 2 and is located at an exchange position opposing the transport opening 15. Accordingly, the raising and lowering pins (not illustrated), which penetrate the through holes in the recess 24 and raise and lower the wafer W while supporting the back surface of the wafer W, and a raising and lowering mechanism (not illustrated) which raises and lowers the raising and lowering pins, are provided at a portion under the turntable 2 and corresponding to the exchange position.

Moreover, a controller 100 is provided in the film forming apparatus according to this embodiment, as illustrated in FIG. 1. The controller 100 controls each part of the film forming apparatus. The controller 100 may be a computer or the like, for example. In addition, a computer program for operating each part of the film forming apparatus may be stored in a non-transitory computer-readable storage medium. The storage medium may be a flexible disk, a compact disk, a hard disk, a flash memory, a Digital Versatile Disk (DVD), or the like, for example. For example, the controller 100 may include a processor, such as a Central Processing Unit (CPU), and may also include the storage medium. The processor may execute the program stored in the storage medium, and control each part of the film forming apparatus to perform a desired operation, that is, a desired film forming process.

[Film Forming Method]

Figure 7:
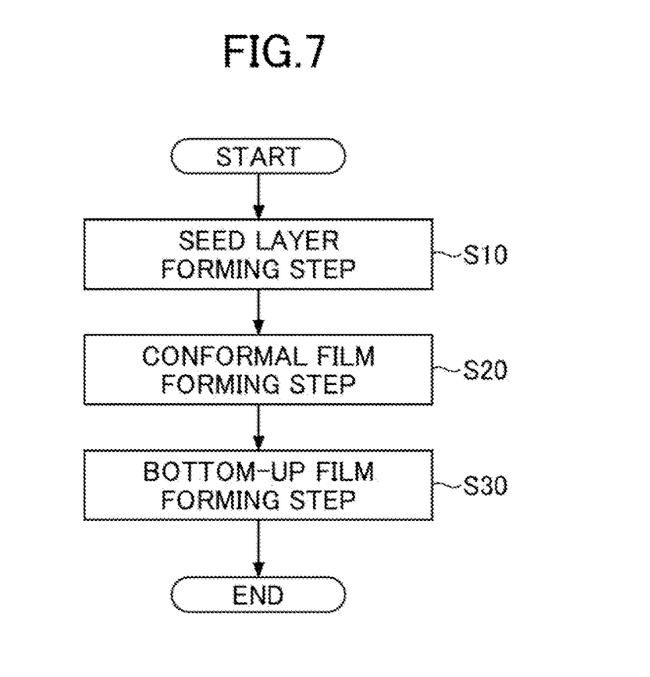
FIG. 7 is a flow chart illustrating an example of a film forming method according to one embodiment.

A film forming method according to one embodiment will be described with reference to an example in which the film forming apparatus described above is used. FIG. 7 is a flow chart illustrating an example of the film forming method according to one embodiment. The film forming method according to this embodiment includes a seed layer forming step (or process) S10, a conformal film forming step (or process) S20, and a bottom-up film forming step (or process) S30.

Figure 8:
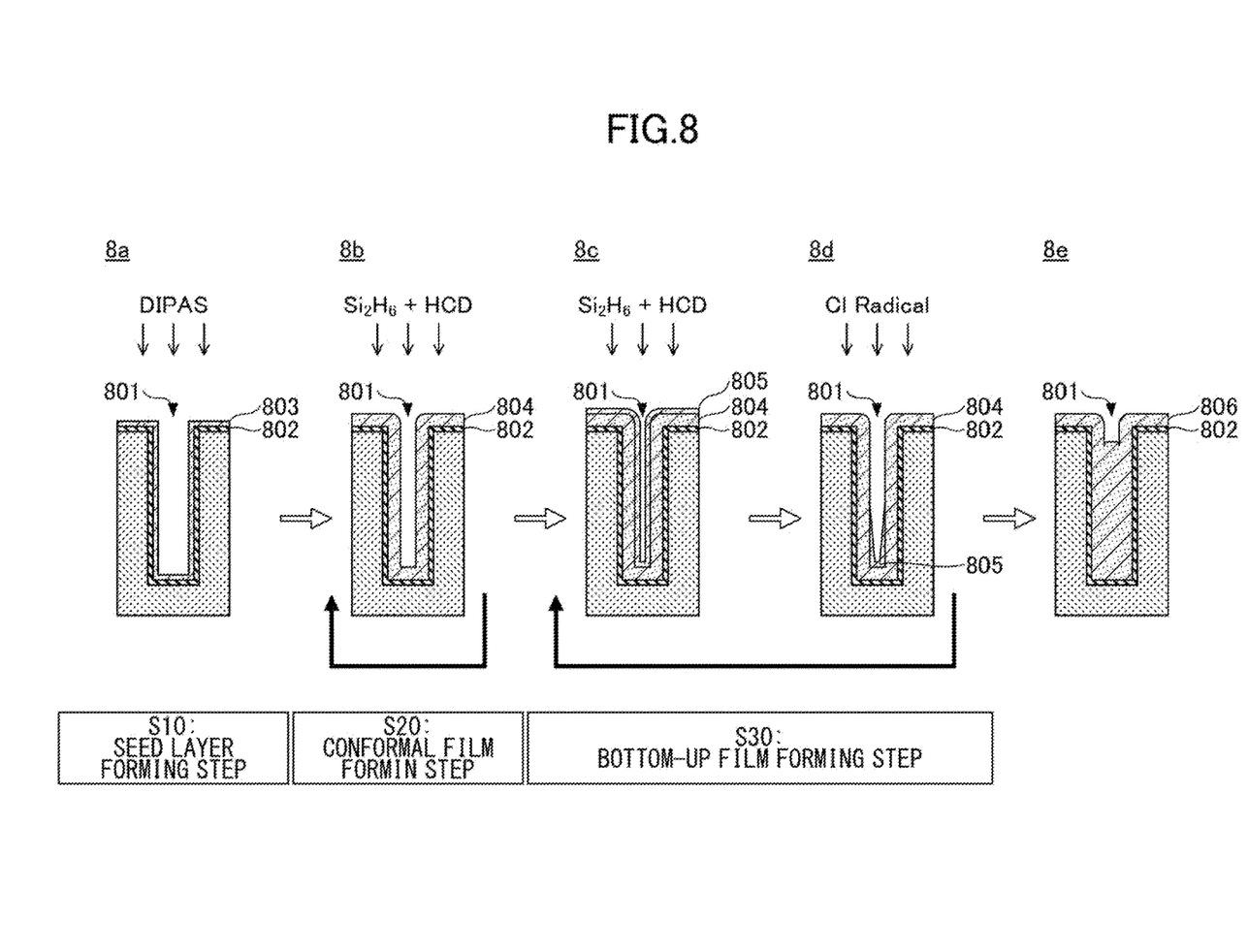
FIG. 8 is a cross sectional view for explaining an example of processes of the film forming method according to one embodiment.

FIG. 8 is a cross sectional view for explaining an example of processes of the film forming method according to one embodiment. In this embodiment, a silicon wafer is used as the wafer W, and the surface of the silicon wafer includes a concave part, such as a trench, a via hole, or the like. It is assumed that a silicon oxide film is conformally formed in the concave part. Further, an example in which the DIPAS gas or the $Si_2H_6$ gas is supplied from the reaction gas nozzle 31, the HCDS gas is supplied from the reaction gas nozzle 32, and the $Cl_2$ gas is supplied from the reaction gas nozzle 33, will be described. Further, it is assumed that the $Cl_2$ gas is radicalized by remote plasma, and supplied as the chlorine radical.

First, the controller 100 opens the gate valve (not illustrated), and delivers the wafer W by the external transport arm 10 illustrated in FIG. 3 into the recess 24 of the turntable 2, via the transport opening 15 illustrated in FIG. 2 and FIG. 3. This delivery is made by raising and lowering the raising and lowering pins (not illustrated) from the bottom of the vacuum chamber 1, through the through holes in the bottom surface of the recess 24, when the recess 24 stops at the exchange position opposing the transport opening 15. The controller 100 performs such a delivery by intermittently rotating the turntable 2, to place the wafer W in each of the five recesses 24 of the turntable 2.

Next, the controller 100 closes the gate valve, and evacuates the vacuum chamber 1 to a reachable vacuum level by the vacuum pump 64. Thereafter, the controller 100 discharges the Ar gas, which is the separation gas, from the separation gas nozzles 41, 42, and 43 at a predetermined flow rate, and also discharges the Ar gas from the separation gas supply pipe 51 and the purge gas supply pipe 72 at a predetermined flow rate. Accordingly, the controller 100 controls the inside of the vacuum chamber 1 to a preset process pressure, by the pressure controller 65 illustrated in FIG. 1. Then, the controller 100 heats the wafer W to 550° C., for example, by the heater unit 7, while rotating the turntable 2 clockwise at a rotational speed of 5 rpm to 20 rpm, for example.

Next, the controller 100 performs the seed layer forming process S10. In the seed layer forming process S10, the controller 100 supplies the DIPAS gas from the reaction gas nozzle 31 of the first process region P1. In the seed layer forming process S10, the DIPAS gas is supplied to the wafer W when the wafer W passes through the first process region P1 as the turntable 2 rotates. Hence, the DIPAS gas is adsorbed onto a surface of a silicon ox-de film 802 formed in a concave part 801, to form a seed layer 803, as illustrated by a state 8a in FIG. 8. By forming the seed layer 803, it is possible to reduce the incubation time, and reduce the film deposition time. In the seed layer forming process S10, the turntable 2 is rotated a predetermined number of times until the seed layer 803 is formed on the surface of the silicon ox de film 802, and the supply of the DIPAS gas is stopped at a stage where the seed layer 803 is formed. The turntable 2 continues to rotate in the state where the wafers W are placed thereon. The seed layer forming process S10 is not essential, and may be performed, as required.

Next, the controller 100 performs the conformal film forming process S20. The conformal film forming process S20 is an example of a film forming process. In the conformal film forming process S20, the controller 100 supplies the $Si_2H_6$ gas from the reaction gas nozzle 31 of the first process region P1, and the HCDS gas from the reaction gas nozzle 32 of the second process region P2. In the conformal film forming process S23, during a time period in which the wafer W passes through the first process region P1 as the turntable 2 rotates, the $Si_2H_6$ gas, which is set to a second temperature lower than a first temperature, is supplied to the wafer W, and a molecular layer of $SiH_3$ is formed on a surface of the seed layer 803. In addition, during a time period in which the wafer W passes through the second process region P2, the HCDS gas is supplied to the wafer W, and the Si—H bond dissociation occurs in the molecular layer of $SiH_3$, to form a molecular layer of $SiCl_3$ on the surface of wafer W having the silicon oxide film 802, the seed layer 803, and the molecular layer of $SiH_3$ formed thereon. Hence, due to the rotation of the turntable 2, the wafer W repeatedly passes through the first process region P1 and the second process region P2, thereby conformally forming a silicon film 804 on the silicon oxide film 802, as illustrated by a state 8b in FIG. 8.

Figure 9:
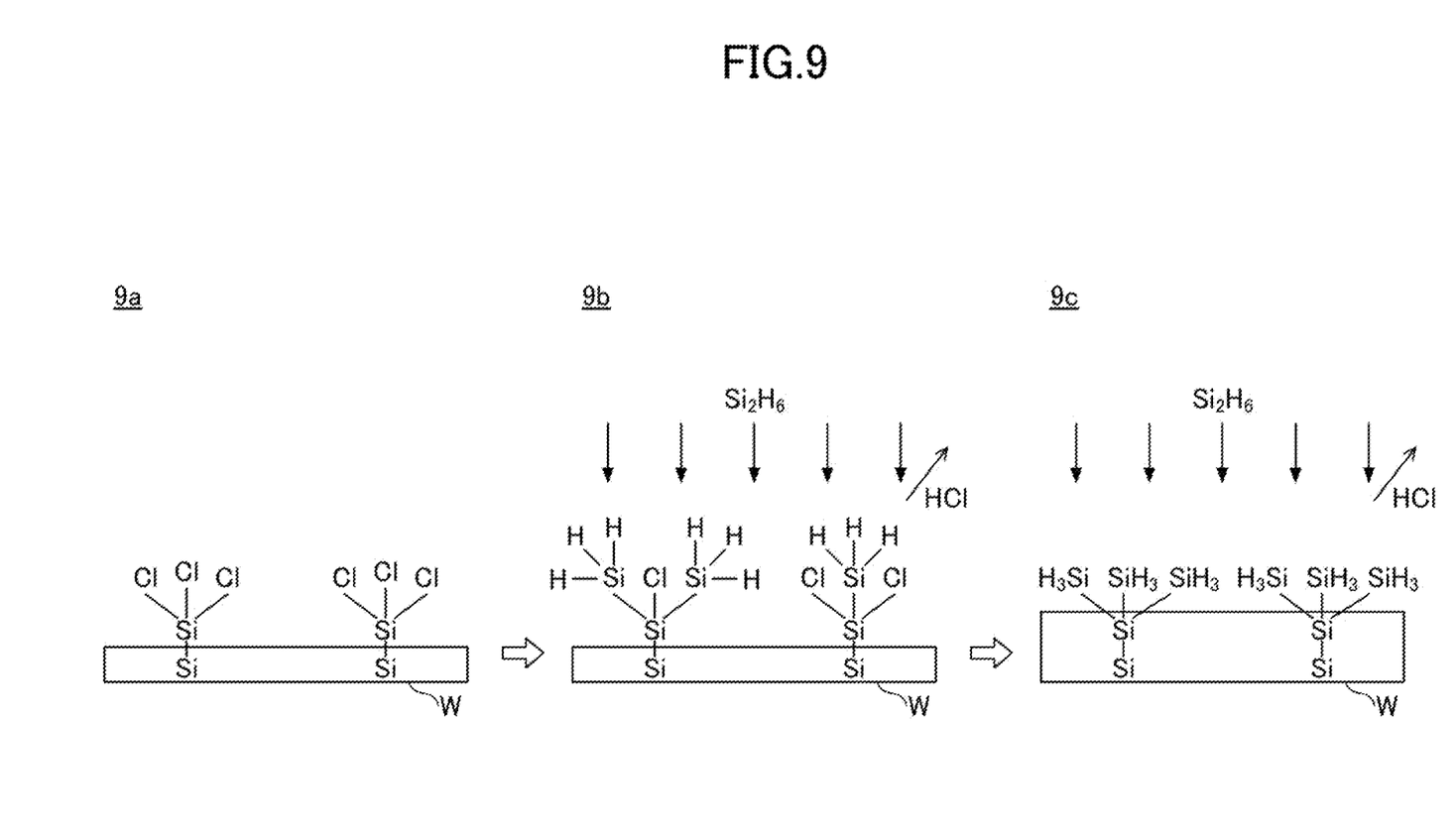
FIG. 9 is a diagram (part 1) for explaining a reaction mechanism of a conformal film forming process.
Figure 10:
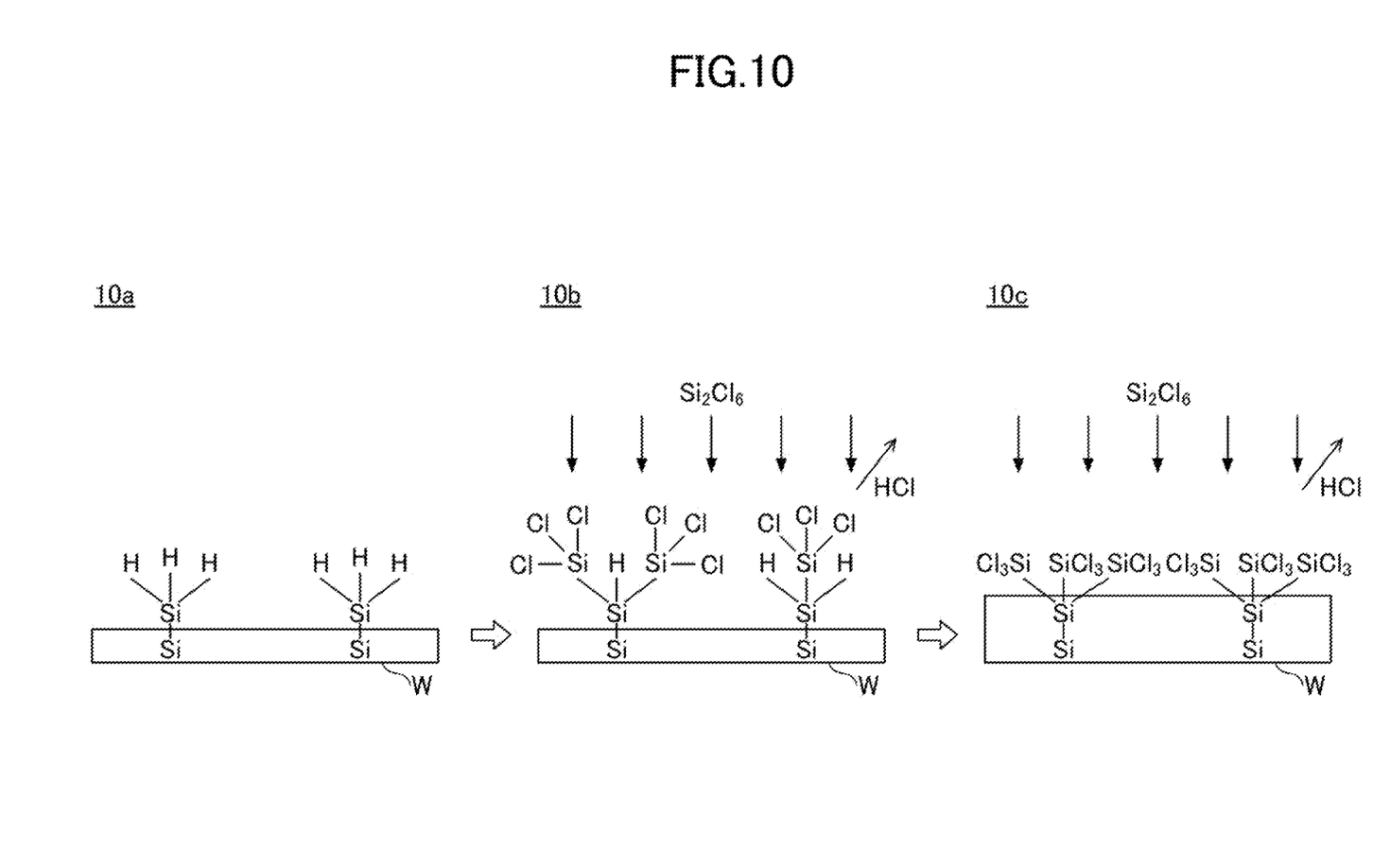
FIG. 10 is a diagram (part 2) for explaining the reaction mechanism of the conformal film forming process.

Referring to FIG. 9 and FIG. 10, a reaction mechanism of the conformal film forming process S20 will be described.

FIG. 9 is a diagram for explaining the reaction mechanism of the conformal film forming process S20, and illustrate an example of a $SiH_3$ molecular layer deposition step (or process) performed in the first process region P1. When the $Si_2H_6$ gas is supplied to the wafer W having the $SiCl_2$ molecular layer formed thereon as illustrated by a state 9a in FIG. 9, the Si—Cl bond dissociation occurs at the surface of the wafer W as illustrated by a state 9b in FIG. 9, and the Si atoms of the $SiH_3$ molecular layer in which the $Si_2H_6$ is pyrolyzed begin to adsorb and bond to each other. Then, as illustrated by a state 9c in FIG. 9, the $SiH_3$ molecular layer is formed on the surface of the wafer W. In other words, the SiH$_3$ molecular layer is formed on the surface of the wafer W by the so-called Atomic Layer Deposition (ALD) or Molecular Layer Deposition (MLD). Such a reaction is generally referred to as the ALD, however, SiH$_3$ is chemically a molecule rather than an atom. For this reason, in this embodiment, the SiH$_3$ is referred to as a molecular layer, and the ALD and the MLD are comprehensively described as encompassing the ALD or the MLD without strictly distinguishing between the ALD and the MLD.

This reaction generally occurs only under conditions where bare silicon is present and the silicon can directly bond to each other in an atmosphere of approximately 450° C. Because the temperature inside the vacuum chamber 1 is set to approximately 550° C. in the film forming apparatus according to this embodiment, this ALD reaction cannot occur in a normal, conventional process. However, in the film forming method according to this embodiment, the Si$_2$H$_6$ gas supplied from the reaction gas nozzle 31 is supplied at room temperature. The room temperature is in a range of 20° C. to 30° C., and is generally approximately 25° C. Accordingly, by supplying the Si$_2$H$_6$ gas to the wafer W at close range at the room temperature, it is possible to instantaneously reduce the temperature near the surface of the wafer W, thereby instantaneously creating the temperature condition of 450° C. As illustrated in FIG. 4, in the first process region P1, the second ceiling surface 45 is higher than the first ceiling surface 44 of the first separation region D1 and the second separation region D2, but the reaction gas nozzle 31 has approximately the same height as the separation gas nozzle 42 and is close to the surface of the wafer W. Accordingly, the Si$_2$H$_6$ gas supplied from the reaction gas nozzle 31 reaches the surface of the wafer W before reaching the same temperature as the ambient atmosphere, thereby generating the MLD reaction that would originally occur only in an atmosphere of approximately 450° C.

The temperature of 550° C. inside the vacuum chamber 1 is the temperature at which the CVD reaction would originally occur when the Si$_2$H$_6$ gas is supplied. Hence, even if SiH$_3$ were adsorbed onto the surface of the wafer W, a SiH$_3$ film may be deposited thereon due to the CVD reaction. However, in the film forming method according to this embodiment, the wafer W having the SiH$_3$ molecular layer adsorbed on the surface thereof is moved to the first separation region D1 without generating an excess CVD reaction, by rotating the turntable 2. In the first separation region D1, the Ar purge gas is supplied into the narrow space, to prevent the Si$_2$H$_6$ gas from flowing into the narrow space, and thus, it is possible to prevent deposition of the SiH$_3$ film on the surface of the SiH$_3$ molecular layer by further CVD reaction.

In other words, in the film forming method according to this embodiment, the condition which instantaneously generates the molecular layer deposition reaction near the surface of the wafer W is created in the first process region P1 to form the molecular layer of SiH$_3$, and after forming this molecular layer of SiH$_3$, the wafer W is rotated and moved to the first separation region D1 before the excess CVD reaction occurs. By appropriately combining the supply of the Si$_2$H$_6$ gas at the room temperature with the rotation and movement of the wafer W, the SiH$_3$ molecular layer deposition reaction, which originally occurs only in a low-temperature atmosphere having a temperature lower than the temperature at which the Si—H bond dissociation can occur, can be generated even in a high-temperature atmosphere having the temperature which the Si—H bond dissociation can occur, and thus, it is possible to form the SiH$_3$ molecular layer.

Because the SiH$_3$ molecular layer is formed in the first process region P1 by the molecular layer deposition reaction described above, the first process region P1 may be referred to as a molecular layer deposition region, a SiH$_3$ adsorption region, an ALD region, or the like.

In this embodiment, an example which supplies the Si$_2$H$_6$ gas at room temperature is described. However, the Si$_2$H$_6$ gas may be supplied at other temperatures lower than 550° C. at which the Si—H bond dissociation can occur. For example, an appropriate gas supply temperature can be set in a range of 0° C. to 50° C., for example, according to the film forming conditions.

In addition, the Si$_2$H$_6$ gas from the first process region P1 can be prevented from flowing into the first separation region D1 by the configuration described in conjunction with FIG. 4 and FIG. 5, and the wafer W passes through the first separation region D1 in a state where the purge gas, such as Ar or the like, is supplied to the surface of the wafer W.

FIG. 10 is a diagram for explaining a reaction mechanism of the conformal film forming process S20, and illustrate an example of a SiCl$_3$ molecular layer deposition step (or process) performed in the second process region P2. When the Si$_2$Cl$_6$ gas is supplied to the wafer W having the SiH$_3$ molecular layer formed thereon as illustrated by a state 10a in FIG. 10, the Si—H bond dissociation occurs at the surface of the wafer W as illustrated by a state 10b in FIG. 10, and the Si atoms of the SiCl$_3$ molecular layer in which the Si$_2$Cl$_3$ is pyrolyzed begin to adsorb and bond to each other. Then, as illustrated by a state 10c in FIG. 10, the SiCl$_3$ molecular layer is formed on the surface of the wafer W. In other words, the SiCl$_3$ molecular layer is formed on the surface of the wafer W by the so-called ALD or MLD.

The HCDS gas from the second process region P2 can be prevented from flowing into the second separation region D2 by the same configuration as the configuration of the first separation region D1 described in conjunction with FIG. 4 and FIG. 5, and the wafer W passes through the second separation region D2 in a state where the purge gas, such as Ar or the like, is supplied to the surface of the wafer W.

The wafer W which passes through the second separation region D2 is rotated and moved to the third process region P3. In this case, because no chlorine radical is supplied in the third process region P3, the etching reaction does not occur.

The wafer W which passes through the third process region P3 is rotated and moved to the third separation region D3. In the third separation region D3, the purge gas, such as Ar or the like, is supplied to the surface of the wafer W, to prevent excess dust or the like from depositing on the surface of the silicon atomic layer.

The wafer W which passes through the third separation region D3 again enters the first process region P1 in a state where the SiCl$_3$ molecular layer is formed on the surface of the wafer W, due to further rotation of the turntable 2, and the SiH$_3$ molecular layer is formed by the MLD described above, and processes similar to those described above are repeated hereafter. Then, by causing the turntable 2 to rotate a plurality of times and make consecutive revolutions, the silicon film forming process described above is repeated, and it is possible to conformally form a silicon film having a desired thickness.

As described above, according to the conformal film forming process S20, the setting of the temperature at which the Si—H bond dissociation can occur inside the vacuum chamber 1, the supply of the disilane gas at the temperature lower than the temperature at which the Si—H bond dissociation can occur, and the rotation of the turntable to prevent the generation of the CVD reaction, are appropriately combined. As a result, the temperature inside the vacuum chamber 1 can be maintained constant, and a highly uniform silicon film can be formed by the ALD with a high productivity.

In addition, according to the conformal film forming process S20, the $Si_2H_6$ gas and the HCDS gas are simultaneously supplied from different regions (the first process region P1 and the second process region P2), and while the turntable 2 undergoes one revolution, the forming of the $SiH_3$ molecular layer and the forming of the $SiCl_3$ molecular layer are performed. In other words, while the turntable 2 undergoes one revolution, the forming of the molecular layer including Si is performed two times. Accordingly, the silicon film using the ALD can be formed in one-half the time compared to the case where the HCDS gas is not supplied to the second process region P2.

The temperature inside the vacuum chamber 1 is approximately 550° C. in the example described above, however, the present disclosure is not limited such an example. Because the temperature of the heater unit 7 simply needs to be set so that the inside of the vacuum chamber 1 is set to a predetermined temperature at which the Si—H bond dissociation occurs, the temperature inside the vacuum chamber 1 may be set to the predetermined temperature in the range of 540° C. to 580° C., for example.

Next, the controller 100 performs the bottom-up film forming process S30. The bottom-up film forming process S30 is an example of an embedding process. In the bottom-up film forming process S30, the controller 100 supplies the $Si_2H_6$ gas from the reaction gas nozzle 31 of the first process region P1, the HCDS gas from the reaction gas nozzle 32 of the second process region P2, and the chlorine radical from the reaction gas nozzle 33 of the third process region P3.

In the bottom-up film forming process S30, during a time period in which the wafer W passes through the first process region P1 as the turntable 2 rotates, the $Si_2H_6$ gas that is set to a second temperature higher than the first temperature is supplied to the wafer W, and a molecular layer of $SiH_3$ is formed on the surface of the wafer W.

In addition, during a time period in which the wafer W passes through the second process region P2, the HCDS gas is supplied to the wafer W, the Si—H bond dissociation occurs in the molecular layer of $SiH_3$, and a $SiCl_3$ atomic layer 805 is formed on the surface of the wafer W having the silicon oxide film 802, the seed layer 803, and the molecular layer of $SiH_3$ formed thereon, as illustrated by a state 8c in FIG. 8.

Moreover, during a time in which the wafer W passes through the third process region P3, the chlorine radical is supplied from the reaction gas nozzle 33 to the wafer W. In this case, the chlorine radical can easily reach the upper surface of the wafer W and an upper portion of the concave part 801, to etch and remove a large portion of the $SiCl_3$ atomic layer 805. On the other hand, because the depth of the concave part 801 is large and deep, the chlorine radical does not reach the bottom surface of the concave part 801, and the $SiC_3$ atomic layer 805 at the bottom surface of the concave part 801 remains virtually unetched. Accordingly, as illustrated by a state 8d in FIG. 8, the $SiCl_3$ atomic layer 805 remains at the bottom surface and the lower inner wall of the concave part 801, while the $SiCl_3$ atomic layer 805 at the upper Inner wall of the concave part 801 is selectively removed.

When the wafer W repeatedly passes through the first process region P1, the second process region P2, and the third process region P3 as the turntable 2 rotates, a bottom-up grown silicon film 806 having a V-shaped cross sectional shape is deposited in the concave part 801, as illustrated by a state 8e in FIG. 8. Hence, the concave part 801 can be filled without closing an opening at the upper port on of the concave part 801, while maintaining a state where formation of voids or seams is unlikely to occur. In addition, because the silicon film 806 is formed by repeating the forming of the molecular layer of $SiH_3$, causing the Si—H bond dissociation of the molecular layer of SN, and the forming the molecular layer of $SiCl_3$, the silicon film 806 that is formed can be dense and have a high film density.

Further, in the bottom-up film forming process S30, because the chlorine radical supplied from the reaction gas nozzle 33 can also easily reach a region on the surface of the turntable 2, not placed with the wafer W, a film deposited on the surface of the turntable 2 is removed by etching. For this reason, a cleaning cycle of the turntable 2 can be extended, thereby increasing the productivity.

In the bottom-up film forming process S30, the chlorine radical may be intermittently supplied from the reaction gas nozzle 33 of the third process region P3. For example, by supplying the chlorine radical from the reaction gas nozzle 33 of the third process region P3 every time the turntable 2 undergoes a predetermined number of revolutions, it is possible to reduce an etching amount of the silicon film and increase a film forming speed or deposition rate.

The embodiments disclosed herein are exemplary in all respects and non-limiting. The embodiments described above may include omissions, substitutions, modifications, or the like in various forms without departing from the scope of the present disclosure.

In the embodiments described above, the HCDS gas is described as the reaction gas supplied to the second process region P2, however, the present disclosure is not limited to using the HCDS gas as the reaction gas. For example, a gas including silicon and chlorine, such as a tetrachlorosilane ($SiCl_4$) gas or the like, may be used in place of the HCDS gas.

Further, in the embodiments described above, the chlorine gas is described as the example of the etching gas supplied to the third process region P3, however, the present disclosure is not limited to using the chlorine gas as the etching gas. For example, a fluorine ($F_2$) gas, a trifluoromethane ($CHF_3$) gas, or the like may be used in place of the chlorine gas. The $F_2$ and $CHF_3$ gases may be radicalized by remote plasma, and supplied as fluorine radicals.

According to each of the embodiments and modifications, it is possible to form a silicon film having an excellent film quality, with a high productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon film on a substrate placed on a turntable which rotates and passes through a first process region and a second process region that are mutually separated along a circumferential direction of the turntable inside a vacuum chamber that is settable to a first temperature at which Si—H bond dissociation can occur, comprising:

a film forming process that includes forming a molecular layer of $SiH_3$ on a surface of the substrate, by supplying a $Si_2H_6$ gas that is set to a second temperature higher than the first temperature during a time period in which the substrate passes through the first process region; and forming a molecular layer of $SiCl_3$ on the surface of the substrate having the molecular layer of $Si_3$ formed thereon while causing the Si—H bond dissociation in the molecular layer of $SiH_3$, by supplying a gas including silicon and chlorine during a time period in which the substrate passes through the second process region.

2. The film forming method as claimed in claim 1, wherein the film forming process performs a plurality of cycles including the forming the molecular layer of $SiH_3$ and the forming the molecular layer of $SiCl_3$.

3. The film forming method as claimed in claim 1, wherein the gas including the silicon and the chlorine is a $Si_2Cl_6$ (HCDS) gas.

4. The film forming method as claimed in claim 1, further comprising:

forming a seed layer on the surface of the substrate, before performing the film forming process.

5. The film forming method as claimed in claim 4, wherein the forming the seed layer includes a process of supplying an aminosilane-based gas to the substrate.

6. The film forming method as claimed in claim 1, wherein a first separation region is disposed between the first process region and the second process region to separate the first process region and the second process region, and the film forming process further includes reducing generation of chemical vapor deposition (CVD) reaction of $SiH_3$, by supplying a purge gas to the surface of the substrate during a time period in which the substrate passes through the first separation region, after forming the molecular layer of $SiH_3$.

7. The film forming method as claimed in claim 1, further comprising:

rotating the substrate with respect to the turntable.

8. The film forming method as claimed in claim 1, wherein a third process region is disposed at a position separated from the second process region along the circumferential direction of the turntable, the surface of the substrate includes a concave part, and further comprising:

an embedding process performed after the film forming process, wherein the embedding process includes forming the molecular layer of $SiH_3$, forming the molecular layer of $SiCl_3$, and selectively removing the molecular layer of $SiCl_3$ on an upper inner wall portion of the concave part, by performing an anisotropic etching on the molecular layer of $SiCl_3$ during a time period in which the substrate passes through the third process region.

9. The film forming method as claimed in claim 8, wherein the film forming process performs a plurality of cycles including the forming the molecular layer of $SiH_3$ and the forming the molecular layer of $SiCl_3$, and the embedding process selectively removes the molecular layer of $SiCl_3$ in at least a part of the plurality of cycles.

10. The film forming method as claimed in claim 9, wherein the anisotropic etching supplies a chlorine radical or a fluorine radical.

11. The film forming method as claimed in claim 10, wherein the chlorine radical or the fluorine radical is supplied approximately parallel to the surface of the substrate.

* * * * *